(12) United States Patent
Yinn et al.

(10) Patent No.: US 8,054,603 B2
(45) Date of Patent: Nov. 8, 2011

(54) POWER CONVERTER, SHORT DETECTION CIRCUIT THEREOF, AND METHOD FOR DETECTING SHORT

(75) Inventors: Aung Aung Yinn, Sinshih Township, Tainan County (TW); Chow-Peng Lee, Sinshih Township, Tainan County (TW)

(73) Assignee: Himax Analogic, Inc. (TW)

( * ) Notice: Subject to any disclaimer, the term of this patent is extended or adjusted under 35 U.S.C. 154(b) by 587 days.

(21) Appl. No.: 12/247,955

(22) Filed: Oct. 8, 2008

(65) Prior Publication Data
US 2010/0085074 A1  Apr. 8, 2010

(51) Int. Cl.
H02H 3/08 (2006.01)
H02H 9/02 (2006.01)
(52) U.S. Cl. ..................... 361/93.1; 361/93.7
(58) Field of Classification Search ............. 361/93.1, 361/93.7
See application file for complete search history.

(56) References Cited

U.S. PATENT DOCUMENTS
7,773,350 B2 * 8/2010 Balakrishnan et al. ......... 361/18
* cited by examiner Primary Examiner — Dharti Patel
(74) Attorney, Agent, or Firm — Hayes Soloway P.C.

(57) ABSTRACT

A short detection circuit, for detecting an output node corresponding to an output voltage converted from an input voltage of a power converter, includes a first current source, a charging/discharging unit, a comparator, and a logic control unit. The charging/discharging unit performs charging operation in accordance with the first current source to generate a charging signal in a shorted condition of the output node. The comparator outputs an enable signal by comparing the charging signal with a reference signal. The logic control unit is controlled by the enable signal to generate a fault signal for turning off a first switch coupled between the output node and the input voltage in the shorted condition of the output node. A method for detecting short of an output node corresponding to an output voltage converted from an input voltage of a power converter is also disclosed herein.

17 Claims, 3 Drawing Sheets

POWER CONVERTER, SHORT DETECTION CIRCUIT THEREOF, AND METHOD FOR DETECTING SHORT

BACKGROUND

1. Field of Invention

The present invention relates to a short detection circuit. More particularly, the present invention relates to a short detection circuit of a power converter.

2. Description of Related Art

White light-emitting diodes (LED) have been more and more popularly employed in liquid crystal display panels. Conventionally, single one driving IC can be designed with high voltage and large current to drive as many LEDs as possible. Thus, how to detect and protect the driving IC and the associated LEDs is important.

When the output node or output pin (e.g. LX) of the driving IC is short, an error amplifier is usually utilized to detect voltage levels such that the over-current protection (OCP) can be thus performed. However, the over-current protection performed by utilizing the error amplifier can possibly fail in some conditions. Therefore, a more assured and securer manner for detecting and protecting the whole circuit should be provided.

SUMMARY

In accordance with one embodiment of the present invention, a short detection circuit, for detecting an output node corresponding to an output voltage converted from an input voltage of a power converter, is provided. The short detection circuit includes a first current source, a charging/discharging unit, a comparator, and a logic control unit. The charging/discharging unit performs charging operation in accordance with the first current source to generate a charging signal in a shorted condition of the output node. The comparator outputs an enable signal by comparing the charging signal with a reference signal. The logic control unit is controlled by the enable signal to generate a fault signal for turning off a first switch coupled between the output node and the input voltage in the shorted condition of the output node.

In accordance with another embodiment of the present invention, a power converter is provided. The power converter includes a first switch and a short detection circuit. The first switch is coupled between an input voltage and an output node corresponding to an output voltage converted from the input voltage. The short detection circuit generates a fault signal for turning off the first switch in a shorted condition of the output node. The short detection circuit includes a charging/discharging unit, a comparator, and a logic control unit. The charging/discharging unit performs charging operation in accordance with a first current source to generate a charging signal in the shorted condition of the output node. The comparator outputs an enable signal by comparing the charging signal with a reference signal. The logic control unit is controlled by the enable signal to generate the fault signal.

In accordance with yet another embodiment of the present invention, a method for detecting short of an output node corresponding to an output voltage converted from an input voltage of a power converter is provided. The method includes the steps of: performing charging operation to generate a charging signal by utilizing a first current source in a shorted condition of the output node; comparing the charging signal with a reference signal to generate an enable signal; and controlling a logic unit by the enable signal to generate a fault signal for turning off a first switch coupled between the output node and the input voltage in the shorted condition of the output node.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
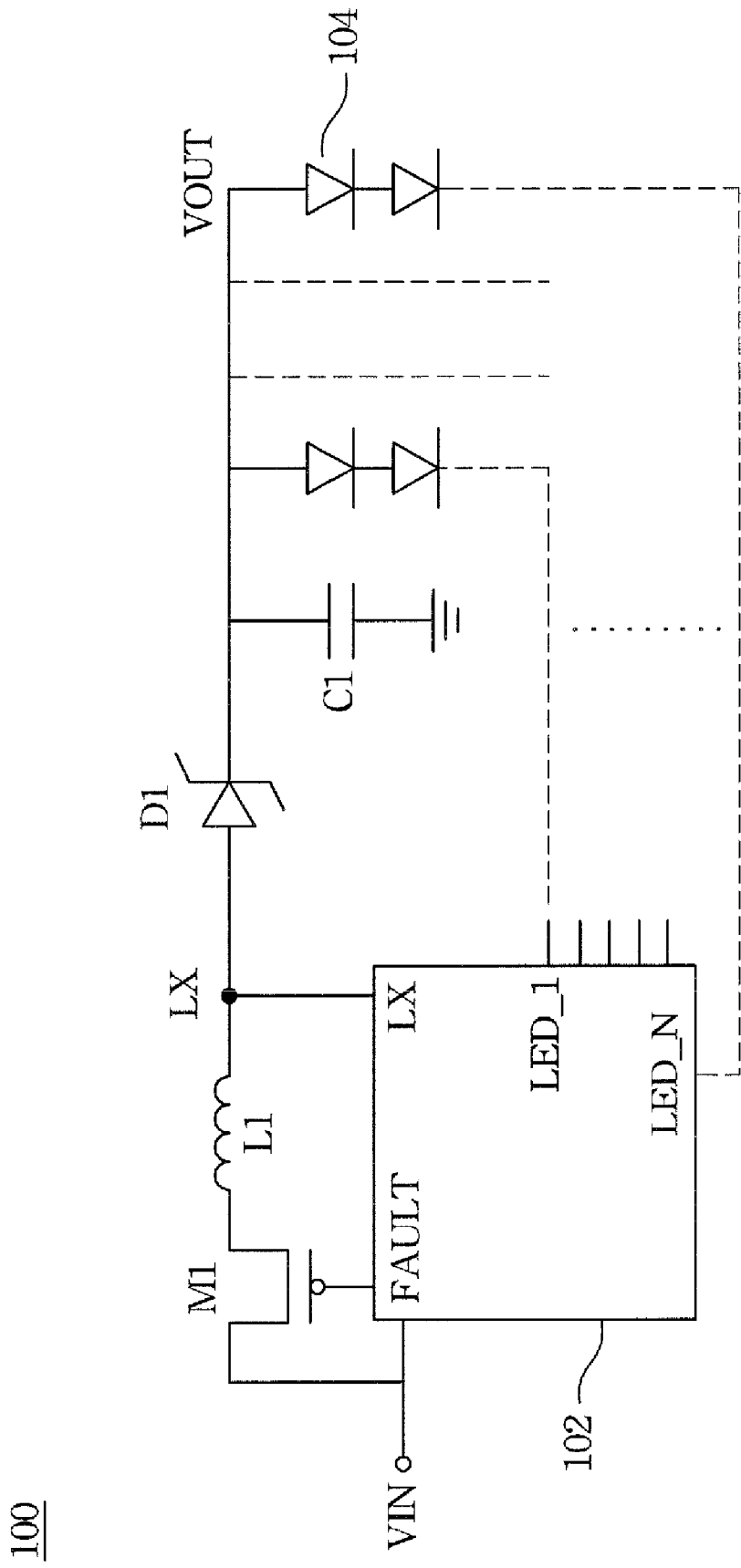
FIG. 1 illustrates a power converter according to one embodiment of the present invention.

FIG. 1 illustrates a power converter according to one embodiment of the present invention. The power converter 100 includes a driving circuit 102, a transistor switch M1, an inductor L1, a diode D1, a capacitor C1 and a plurality of series-connected light-emitting diodes (LED) 104, in which the driving circuit 102 can be designed to be single one driving IC. The driving circuit 102 is powered by an input voltage VIN to drive the series-connected LEDs 104. The transistor switch M1, can be implemented by a PMOS transistor having a gate coupled to the FAULT terminal of the driving circuit 102, a first source/drain coupled to the input voltage VIN, and a second source/drain coupled to an output node LX through the inductor L1. One end of the inductor L1, the LX terminal of the driving circuit 102 (i.e. output node of the power converter 100), and the anode of the diode D1 are coupled with each other at the output node LX. The capacitor C1 is coupled between a ground and the cathode of the diode D1.

When the power converter 100 operates normally or in a non-shorted condition, the transistor switch M1 turns on so that the inductor L1 is charged by the input voltage VIN and an output voltage VOUT, corresponding the output node LX or the LX terminal of the driving circuit 102, converted from the input voltage VIN, is thus generated at the cathode of the diode D1.

Figure 2:
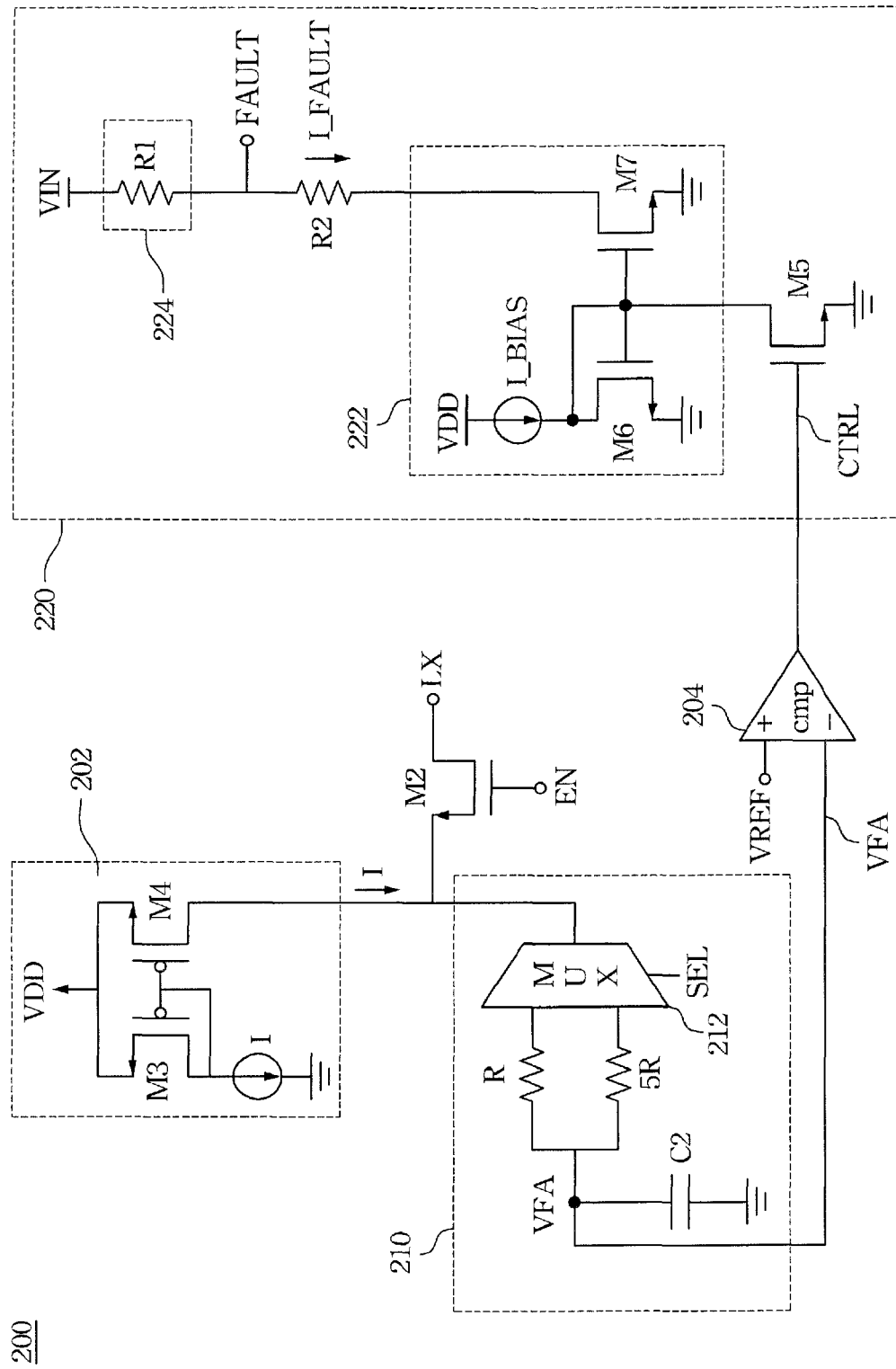
FIG. 2 illustrates a short detection circuit according to one embodiment of the present invention.

The driving circuit 102 further includes a short detection circuit for detecting the output node LX corresponding to the output voltage VOUT converted from the input voltage VIN of the power converter 100. FIG. 2 illustrates a short detection circuit according to one embodiment of the present invention. The short detection circuit 200 includes a current source 202, a transistor switch M2, a charging/discharging unit 210, a comparator 204, and a logic control unit 220.

The current source 202 provides a current I and can be implemented by a current mirror consisting of two PMOS transistors M3 and M4. The transistor switch M2 is coupled between the output node LX and the current source 202. In the non-shorted condition of the output node LX, the transistor switch M2 is turned on by an enable signal EN, such that the output node LX is conducted and the power converter 100 can operate as usual. In the present embodiment, the transistor switch M2 can be an NMOS transistor having a gate controlled by the enable signal EN, a drain coupled to the output node LX, and a source coupled to the current source 202.

The charging/discharging unit 210 performs charging and discharging operation in accordance with the current I provided by the current source 202. The charging/discharging unit 210 generates a charging signal in the shorted condition of the output node LX and generates a discharging signal in the non-shorted condition of the output node LX. The charging/discharging unit 210 can further include an energy storing element (e.g. capacitor C2), a charging element (e.g. resistor R), a discharging element (e.g. resistor 5R), and a multiplexer 212.

The multiplexer 212 is coupled to the resistor R and the resistor 5R and selects one current path for current flowing through the resistor R or the resistor 5R. The resistors R and 5R are connected in parallel and both coupled to the capacitor C2, such that the capacitor C2 can be charged through the resistor R to generate the charging signal in the shorted condition of the output node LX or discharged through the resistor 5R to generate the discharging signal in the non-shorted condition of the output node LX. Notably, the values of the resistors R and 5R are different in the present embodiment; for example, the resistor 5R is five times the value of the resistor R, in order to reduce the discharging duration and speed up the In the shorted condition of the output node LX, the transistor switch M2 turns off and the current I flows to the charging/discharging unit 210. At that moment, the multiplexer 212 selects the current path for the current I to flow through the resistor R, and the capacitor C2 is thus charged to generate the charging signal (i.e. VFA) transmitted to the comparator 204. On the other hand, in the non-shorted condition of the output node LX, the transistor switch M2 turns on. At that moment, the multiplexer 212 selects the current path for current to flow through the resistor 5R, and the capacitor C2 is thus discharged to generate the discharging signal (i.e. VFA) transmitted to the comparator 204.

The comparator 204 is coupled to the charging/discharging unit 210 and receives the charging/discharging signal VFA to output an enable/disable signal CTRL in accordance with the charging/discharging signal VFA. When the capacitor C2 is charged to generate the charging signal VFA, the comparator 204 outputs the enable signal CTRL by comparing the charging signal VFA with a reference signal VREF. On the other hand, when the capacitor C2 is discharged to generate the discharging signal VFA, the comparator 204 outputs the disable signal CTRL by comparing the charging signal VFA with the reference signal VREF.

The logic control unit 220 is controlled by the enable/disable signal CTRL to generate a fault/non-fault signal FAULT. The logic control unit 220 further includes a current source 222, a detecting element 224 and a transistor switch M5. The current source 222 provides a current I_BIAS and can be implemented by a current mirror consisting of two NMOS transistors M6 and M7. The detecting element 224 is coupled between the input voltage VIN and the current source 222, and can be implemented by a resistor R1 having one end coupled to the input voltage VIN and the other end, generating the fault/non-fault signal FAULT, coupled to the current source 222 through a resistor R2. The transistor switch M5 is coupled between the current source 222 and the comparator 204. The transistor switch M5 can be an NMOS transistor having a gate for receiving the enable/disable signal CTRL output from the comparator 204, a source coupled to the ground, and a drain coupled to the gates of the NMOS transistors M6 and M7.

In the shorted condition of the output node LX, the comparator 204 outputs the enable signal CTRL as described above, and the transistor switch M5 is turned on by the enable signal CTRL to switch off the current source 222; that is, the NMOS transistors M6 and M7 are switched off, such that the current I_FAULT, corresponding to the current I_BIAS, is not generated. Accordingly, the resistor R1 detects no current flowing therethrough and the fault signal FAULT, at a high level, is thus generated for turning off the transistor switch M1 (shown in FIG. 1), and the power converter 100 is thus protected.

On the other hand, in the non-shorted condition of the output node LX, the comparator 204 outputs the disable signal CTRL as described above, and the transistor switch M5 is turned off by the disable signal CTRL to switch on the current source 222; that is, the NMOS transistors M6 and M7 are switched on, such that the current I_FAULT, corresponding to the current I_BIAS, is generated. Accordingly, the resistor R1 detects the current flowing therethrough and the non-fault signal FAULT, at a low level, is thus generated for turning on the transistor switch M1 (shown in FIG. 1), and the power converter 100 can thus operate normally.

Figure 3:
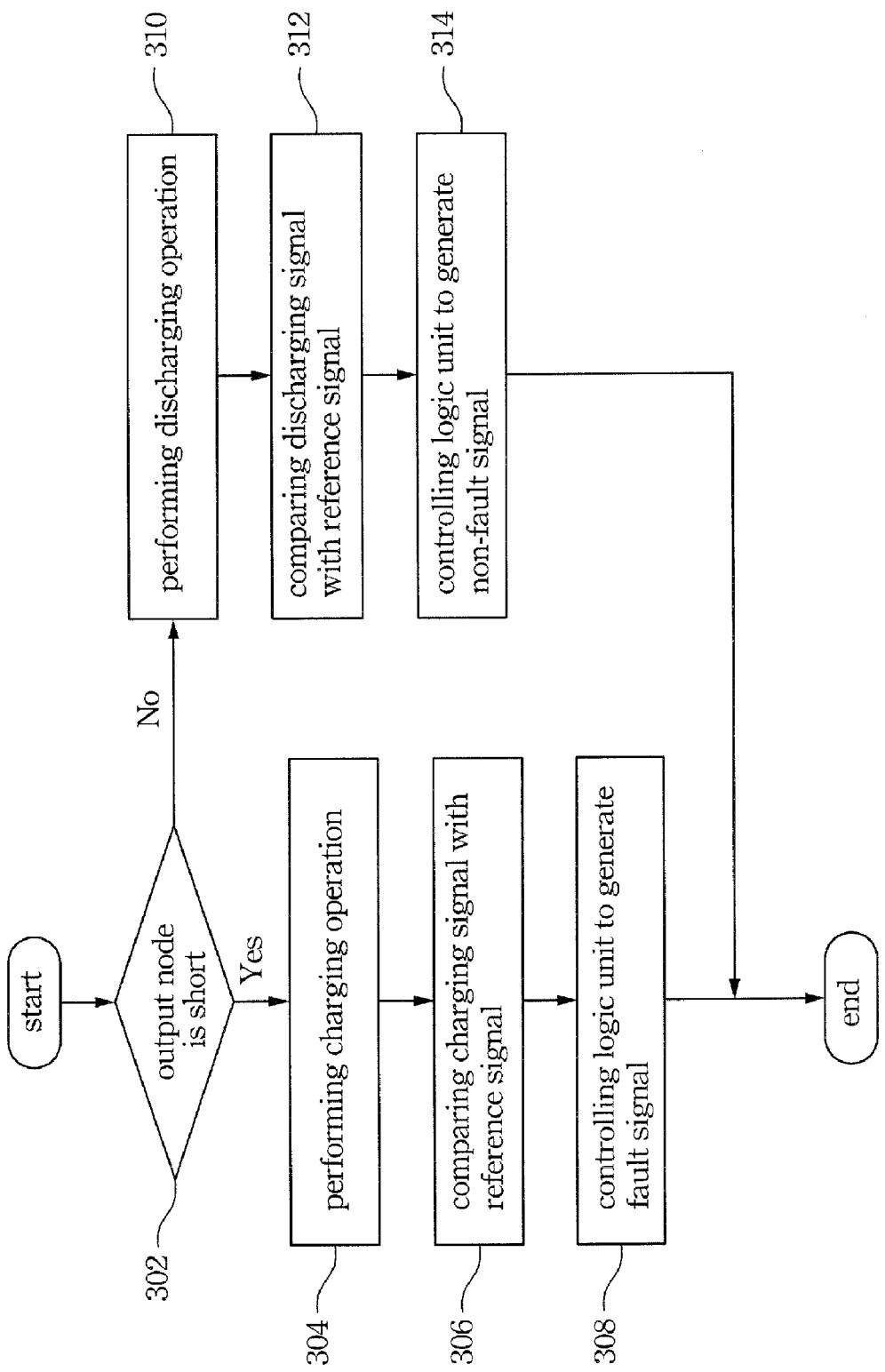
FIG. 3 illustrates a flow chart of a method for detecting short of an output node corresponding to an output voltage converted from an input voltage of a power converter.

FIG. 3 illustrates a flow chart of a method for detecting short of an output node corresponding to an output voltage converted from an input voltage of a power converter. Refer to FIGS. 1, 2, and 3. First, whether the output node LX of the power converter 100 (or LX terminal of the driving circuit 102) is in the shorted condition or not is determined (Step 302). If the output node LX is in the shorted condition, a charging operation is performed to generate the charging signal VFA, for example, by utilizing the current source 202 (Step 304). Then, the charging signal VFA is compared with the reference signal VREF, for example, by the comparator 204, to generate the enable signal CTRL (Step 306). Afterward, the logic unit 220 is controlled by the enable signal CTRL to generate the fault signal FAULT for turning off the transistor switch M1 (Step 308). Once the transistor switch M1 is turned off, the power converter 100 can be deemed as being shut down and thus protected.

In the Step 304, the energy storing element, e.g. C2, can be charged by the current source 202 and the charging element, e.g. R, to generate the charging signal VFA. In the Step 308, the transistor switch M5 can be turned on by the enable signal CTRL to switch off the current source 222. When the current source 222 is switched off, the fault signal FAULT can be generated according to the detecting element 224 and the input voltage VIN.

On the other hand, if the output node LX is in the non-shorted condition, a discharging operation is performed to generate the discharging signal VFA (Step 310). Then, the discharging signal VFA is compared with the reference signal VREF, for example, by the comparator 204, to generate the disable signal CTRL (Step 312). Afterward, the logic unit 220 is controlled by the disable signal CTRL to generate the non-fault signal FAULT for turning on the transistor switch M1 (Step 314). Once the transistor switch M1 is turned on, the power converter 100 can operate as usual.

In the Step 310, the energy storing element, e.g. C2, can be discharged by the discharging element, e.g. 5R, to generate the discharging signal VFA. In the Step 314, the transistor switch M5 can be turned off by the disable signal CTRL to switch on the current source 222. When the current source 222 is switched on, the non-fault signal FAULT can be generated according to the detecting element 224 and the input voltage VIN.

According to the foregoing embodiment, the short detection circuit of the power converter and the method for detecting short can be employed such that the power converter can be well protected when the output of the power converter is in the shorted condition. Therefore, the reliability of the power converter can be increased ad the system employing the power converter can be safer.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A short detection circuit for detecting an output node corresponding to an output voltage converted from an input voltage of a power converter, the short detection circuit comprising:
   a first current source;
   a charging/discharging unit performing charging operation in accordance with the first current source to generate a charging signal in a shorted condition of the output node;
   a comparator outputting an enable signal by comparing the charging signal with a reference signal; and
   a logic control unit controlled by the enable signal to generate a fault signal for turning off a first switch coupled between the output node and the input voltage in the shorted condition of the output node, wherein the logic control unit further comprises:
   a second current source;
   a detecting element coupled between the input voltage and the second current source, and
   a second switch turned on by the enable signal to switch off the second current source such that the fault signal is generated according to the detecting element and the input voltage.

2. The short detection circuit as claimed in claim 1, wherein the charging/discharging unit further comprises:
   an energy storing element; and
   a charging element coupled to the energy storing element such that the energy storing element is charged to generate the charging signal in the shorted condition of the output node.

3. The short detection circuit as claimed in claim 2, wherein the charging/discharging unit further comprises:
   a discharging element coupled to the energy storing element and connected in parallel with the charging element such that the energy storing element is discharged to generate a discharging signal in a non-shorted condition of the output node.

4. The short detection circuit as claimed in claim 3, wherein the comparator outputs a disable signal by comparing the discharging signal with the reference signal to turn off the second switch such that the second current source is switched on and a non-fault signal for turning on the first switch is generated according to the detecting element and the input voltage.

5. The short detection circuit as claimed in claim 3, wherein the charging/discharging unit further comprises:
   a multiplexer coupled to the charging element and the discharging element and selecting current path for current flowing through the charging element or the discharging element.

6. The short detection circuit as claimed in claim 1, further comprising:
   a third switch coupled between the output node and the first current source and turned on in a non-shorted condition of the output node.

7. A power converter, comprising:
   a first switch coupled between an input voltage and an output node corresponding to an output voltage converted from the input voltage; and
   a short detection circuit generating a fault signal for turning off the first switch in a shorted condition of the output node, the short detection circuit comprising:
   a charging/discharging unit performing charging operation in accordance with a first current source to generate a charging signal in the shorted condition of the output node;
   a comparator outputting an enable signal by comparing the charging signal with a reference signal; and
   a logic control unit controlled by the enable signal to generate the fault signal,
   wherein the logic control unit further comprises:
   a second current source;
   a detecting element coupled between the input voltage and the second current source; and
   a second switch turned on by the enable signal to switch off the second current source such that the fault signal is generated according to the detecting element and the input voltage.

8. The power converter as claimed in claim 7, wherein the charging/discharging unit further comprises:
   an energy storing element; and
   a charging element coupled to the energy storing element such that the energy storing element is charged to generate the charging signal in the shorted condition of the output node.

9. The power converter as claimed in claim 8, wherein the charging/discharging unit further comprises:
   a discharging element coupled to the energy storing element and connected in parallel with the charging element such that the energy storing element is discharged to generate a discharging signal in a non-shorted condition of the output node.

10. The power converter as claimed in claim 9, wherein the comparator outputs a disable signal by comparing the discharging signal with the reference signal to turn off the second switch such that the second current source is switched on and a non-fault signal for turning on the first switch is generated according to the detecting element and the input voltage.

11. The power converter as claimed in claim 9, wherein the charging/discharging unit further comprises:
   a multiplexer coupled to the charging element and the discharging element and selecting current path for current flowing through the charging element or the discharging element.

12. The power converter as claimed in claim 7, further comprising:
   a third switch coupled between the output node and the first current source and turned on in a non-shorted condition of the output node.

13. A method for detecting short of an output node corresponding to an output voltage converted from an input voltage of a power converter, the method comprising the steps of:

performing charging operation to generate a charging signal by utilizing a first current source in a shorted condition of the output node;

comparing the charging signal with a reference signal to generate an enable signal; and controlling a logic unit by the enable signal to generate a fault signal for turning off a first switch coupled between the output node and the input voltage in the shorted condition of the output node, wherein the controlling step further comprises:

turning on a second switch by the enable signal to switch off a second current source; and generating the fault signal according to a detecting element and the input voltage.

14. The method as claimed in claim 13, wherein the step of performing charging operation further comprises the step of:

charging an energy storing element by the first current source and a charging element coupled to the energy storing element to generate the charging signal.

15. The method as claimed in claim 14, further comprising the step of:

performing discharging operation to generate a discharging signal in a non-shorted condition of the output node.

16. The method as claimed in claim 15, wherein the step of performing discharging operation further comprises the step of:

discharging the energy storing element by a discharging element coupled to the energy storing element to generate the discharging signal.

17. The method as claimed in claim 15, further comprising the steps of:

comparing the discharging signal with the reference signal to generate a disable signal; and controlling the logic unit by the disable signal to generate a non-fault signal for turning on the first switch.

\* \* \* \* \*